United States Patent
Luo

(10) Patent No.: US 8,987,704 B2
(45) Date of Patent: Mar. 24, 2015

(54) SEMICONDUCTOR LIGHT EMITTING STRUCTURE

(71) Applicant: Lextar Electronics Corporation, Hsinchu (TW)

(72) Inventor: Chuan-Yu Luo, Taoyuan (TW)

(73) Assignee: Lextar Electronics Corporation, Hsinchu (TW)

( * ) Notice: Subject to any disclaimer, the term of this patent is extended or adjusted under 35 U.S.C. 154(b) by 48 days.

(21) Appl. No.: 13/832,149

(22) Filed: Mar. 15, 2013

(65) Prior Publication Data

US 2013/0334493 A1 Dec. 19, 2013

(30) Foreign Application Priority Data

Jun. 13, 2012 (TW) ................. 101121168 A

(51) Int. Cl.
*H01L 33/00* (2010.01)
*H01L 33/04* (2010.01)
*H01L 33/06* (2010.01)

(52) U.S. Cl.
CPC ............. *H01L 33/04* (2013.01); *H01L 33/06* (2013.01)
USPC .................................. 257/14; 257/E33.008

(58) Field of Classification Search
USPC ..................... 257/13, 14, E33.008
See application file for complete search history.

(56) References Cited

U.S. PATENT DOCUMENTS

| | | | |
|---|---|---|---|
| 6,586,762 B2 | 7/2003 | Kozaki | |
| 8,076,684 B2 * | 12/2011 | Taki | 257/97 |
| 8,212,265 B2 * | 7/2012 | Han et al. | 257/86 |
| 2002/0190259 A1 * | 12/2002 | Goetz et al. | 257/79 |
| 2009/0152586 A1 * | 6/2009 | Lee et al. | 257/103 |
| 2010/0176372 A1 * | 7/2010 | Yoo et al. | 257/13 |
| 2010/0252811 A1 * | 10/2010 | Kozaki | 257/14 |
| 2011/0187294 A1 * | 8/2011 | Bergmann et al. | 315/363 |
| 2012/0235116 A1 * | 9/2012 | Su et al. | 257/13 |
| 2013/0292638 A1 * | 11/2013 | Shur et al. | 257/13 |

FOREIGN PATENT DOCUMENTS

| | | | |
|---|---|---|---|
| TW | 1259634 A | 8/2006 | |
| TW | 201007981 | 2/2010 | |
| WO | WO2011/014822 A2 * | 2/2011 | H01L 33/08 |

OTHER PUBLICATIONS

English Abstract translation of TW201007981 (Published Feb. 16, 2010).
TW Office Action dated Dec. 19, 2014.

* cited by examiner

*Primary Examiner* — Victor A Mandala
(74) *Attorney, Agent, or Firm* — McClure, Qualey & Rodack, LLP

(57) ABSTRACT

A semiconductor light emitting structure including an n-type semiconductor layer, a p-type semiconductor layer and an active layer is provided. The active layer disposed between the n-type semiconductor layer and the p-type semiconductor layer is a multi-quantum well structure consisting of well layers and barrier layers interlaced and stacked to each other. The well layers near the n-type semiconductor layer at least include a first well layer having a first thickness, and the well layers near the p-type semiconductor layer at least include a second well layer having a second thickness smaller than the first thickness, so that the ability to restrict electrons within the area of the active layer near the n-type semiconductor layer is increased, and the conversion efficiency of the active layer is enhanced. There is a differential $\Delta d1$ between the first thickness and the second thickness, wherein $0\ \mathrm{nm} < \Delta d1 \leq 10\ \mathrm{nm}$.

12 Claims, 3 Drawing Sheets

US 8,987,704 B2

SEMICONDUCTOR LIGHT EMITTING STRUCTURE

This application claims the benefit of Taiwan application Serial No. 101121168, filed Jun. 13, 2012, the subject matter of which is incorporated herein by reference.

BACKGROUND OF THE INVENTION

1. Field of the Invention

The invention relates in general to a semiconductor light emitting structure, and more particularly to a semiconductor light emitting structure with better electron restricting ability.

2. Description of the Related Art

Light emitting diode (LED) is a semiconductor light emitting structure which emits a light by converting electric energy into photo energy. Conventional LED includes an epitaxy stacking structure and an upper electrode layer and a lower electrode layer respectively disposed on a top surface and a bottom surface of the epitaxy stacking structure. When electricity is provided to the upper and the lower electrode layer of the LED, the current flows through the epitaxy stacking structure, which releases energy in the form of a light when electrons and electron holes are combined.

The epitaxy stacking structure forms a first semiconductor layer, an active layer and a second semiconductor layer by organic metal chemical vapor deposition (MOCVD) method. Then, a donor and an acceptor are respectively doped into the first semiconductor layer and the second semiconductor layer to form an n-type semiconductor layer carrying negative charges and a p-type semiconductor layer carrying positive charges, so that the LED can transmit currents through the conduction of electrons or electron holes.

In addition, the conventional LED includes an electron blocking layer formed by $Al_xGa_{(1-x)}N$ semiconductor material having high energy gap and used for blocking and restricting electrons to be within the active layer, wherein $0 \leq x \leq 1$. However, when the electron blocking layer is too thick or the Al content of the $Al_xGa_{(1-x)}N$ compound is too high, the series resistance of the epitaxy stacking structure will be too high, and a higher bias is required for driving the LED. Besides, the $Al_xGa_{(1-x)}N$ semiconductor material has a higher energy gap, making electron holes hard to cross over the electron blocking layer and be transmitted to the active layer. Therefore, the conversion efficiency of the active layer is relatively reduced, and the luminous uniformity of the light emitted by the active layer is poor and needs to be improved.

SUMMARY OF THE INVENTION

The invention is directed to a semiconductor light emitting structure, in which the ability to restrict electrons within the active layer is improved so as to enhance the conversion efficiency of the active layer.

According to an embodiment of the present invention, a semiconductor light emitting structure including an n-type semiconductor layer, a p-type semiconductor layer and an active layer is provided. The active layer disposed between the n-type semiconductor layer and the p-type semiconductor layer is a multi-quantum well (MQW) structure consisting of a plurality of well layers and a plurality of barrier layers interlaced and stacked to each other. The well layers near the n-type semiconductor layer at least include a first well layer having a first thickness, and the well layers near the p-type semiconductor layer at least include a second well layer having a second thickness smaller than the first thickness, so that the ability to restrict electrons within the area of the active layer near the n-type semiconductor layer is increased, and the conversion efficiency of the active layer is enhanced. There is a differential $\Delta d1$ between the first thickness and the second thickness, wherein $0 \text{ nm} < \Delta d1 \leq 10 \text{ nm}$.

According to another embodiment of the present invention, a semiconductor light emitting structure including an n-type semiconductor layer, a p-type semiconductor layer and an active layer is provided. The active layer disposed between the n-type semiconductor layer and the p-type semiconductor layer is a multi-quantum well structure consisting of a plurality of well layers and a plurality of barrier layers interlaced and stacked to each other. The barrier layers near the n-type semiconductor layer at least include a first barrier layer having a first thickness, and the barrier layers near the p-type semiconductor layer at least include a second barrier layer having a second thickness smaller than the first thickness, so that the ability to restrict electrons within the area of the active layer near the n-type semiconductor layer is increased, and the conversion efficiency of the active layer is enhanced.

According to an alternate embodiment of the present invention, a semiconductor light emitting structure including an n-type semiconductor layer, a p-type semiconductor layer, an active layer and a plurality of the first electron blocking layers is provided. The active layer disposed between the n-type semiconductor layer and the p-type semiconductor layer is a multi-quantum structure consisting of a plurality of well layers and a plurality of barrier layers interlaced and stacked to each other. The first electron blocking layers near the n-type semiconductor layer are interlaced and stacked with the well layers and the barrier layers, so that the ability to restrict electrons within the area of the active layer near the n-type semiconductor layer is increased, and the conversion efficiency of the active layer is enhanced.

The above and other aspects of the invention will become better understood with regard to the following detailed description of the preferred but non-limiting embodiment(s). The following description is made with reference to the accompanying drawings.

DETAILED DESCRIPTION OF THE INVENTION

According to the semiconductor light emitting structure of the present disclosure, the ability to restrict electrons within the area of the active layer is increased and the conversion efficiency of the active layer is enhanced through the adjustment in the multi-quantum well (MQW) structure of the active layer near the n-type semiconductor layer. Examples of the adjustment include increasing the thickness of the well layer near the n-type semiconductor layer or the thickness of the barrier layer near the n-type semiconductor layer, and adding an electron blocking layer (EBL) to the active layer near the n-type semiconductor layer. In an embodiment, the n-type semiconductor layer, the p-type semiconductor layer, and the well layer and the barrier layer of the active layer are formed by a material selected from a group consisting of gallium nitride (GaN), indium gallium nitride (InGaN), aluminum gallium nitride (AlGaN) and aluminum indium gallium nitride (AlInGaN). For example, the well layer and the barrier layer of the active layer are formed by indium gallium nitrides (InGaN) with different indium contents, so that the energy gap of the barrier layer is larger than that of the well layer. When the thickness of the well layer or the barrier layer near the n-type semiconductor layer is increased, more electrons will be restricted within the area of the active layer near the n-type semiconductor layer. In another embodiment, the electron blocking layer is formed by aluminum gallium nitride (AlGaN) containing an n-type dopant. The electron blocking layer near the n-type semiconductor layer is interlaced and stacked with the well layer and the barrier layer, and the energy gap of the electron blocking layer is larger than that of the well layer and the barrier layer. Therefore, more electrons restricted within the area of the active layer near the n-type semiconductor layer are uniformly distributed and the conversion efficiency of the active layer is enhanced.

A number of embodiments are disclosed below for elaborating the invention. However, the embodiments of the invention are for detailed descriptions only, not for limiting the scope of protection of the invention.

First Embodiment

Figure 1:
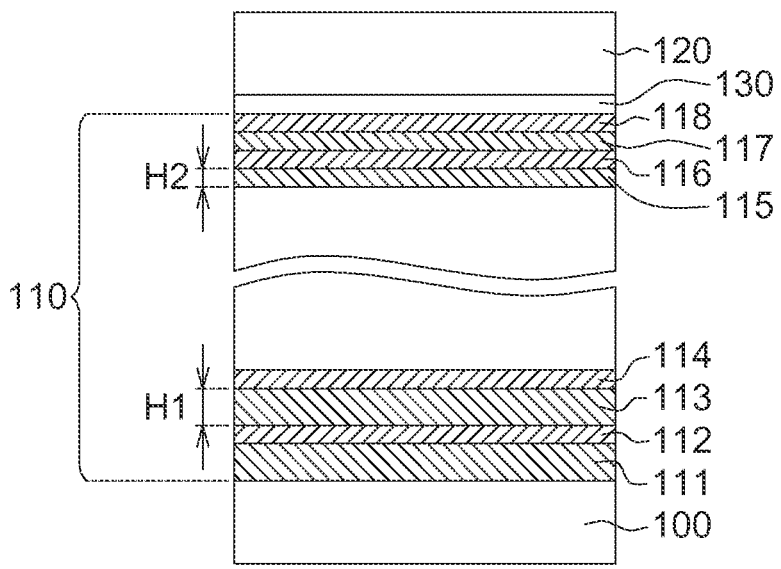
FIG. 1 shows a schematic diagram of a semiconductor light emitting structure according to an embodiment of the invention.

Referring to FIG. 1, a schematic diagram of a semiconductor light emitting structure according to an embodiment of the invention is shown. The semiconductor light emitting structure 10 includes an n-type semiconductor layer 100, a p-type semiconductor layer 120 and an active layer 110 disposed between the n-type semiconductor layer 100 and the p-type semiconductor layer 120. The active layer 110 may be a multi-quantum well (MQW) structure having 1030 layers but the invention is not limited thereto. In FIG. 1, only the well layers 111, 113, 115, and 117 and the barrier layers 112, 114, 116, and 118 are illustrated, and the well layers 111, 113, 115, and 117 are interlaced and stacked with the barrier layers 112, 114, 116, and 118. The well layers 111 and 113 near the n-type semiconductor layer 100 at least include a well layer having a first thickness H1, and the well layers 115 and 117 near the p-type semiconductor layer 120 at least include a well layer having a second thickness H2 smaller than the first thickness H1, and there is a differential Δd1 between the first thickness H1 and the second thickness H2. Preferably, 0 nm<Δd1≤10 nm. That is, in the present embodiment, the thickness of the well layer near the n-type semiconductor layer 100 is increased so that more electrons e⁻ are restricted to be within the active layer 110 near the n-type semiconductor layer 100 when electrons flow to the active layer 110 form the n-type semiconductor layer 100, and the conversion efficiency of the active layer 110 is enhanced.

Figure 2:
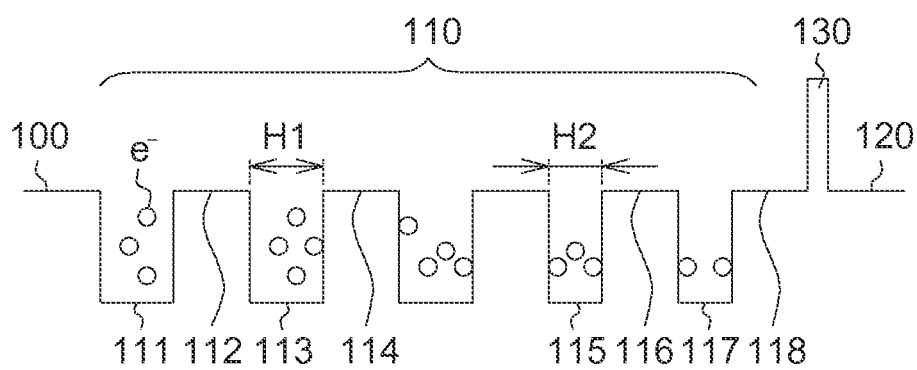
FIG. 2 shows a schematic diagram of an energy band of a semiconductor light emitting structure of FIG. 1.

FIG. 2 shows a schematic diagram of an energy band of a semiconductor light emitting structure 10 of FIG. 1. In short, the semiconductor material used for manufacturing LED may be formed by a III-V compound such as GaN, InGaN, AlGaN or AlInGaN. Different contents of indium and aluminum of the GaN compound semiconductor generate different energy gaps for adjusting the wavelengths of the emitted light. The energy gap denotes the gap between the electrons in the valence band and the electrons in the conduction band. A larger energy gap indicates that higher energy is required for the electrons in the valence band to enter the conduction band.

As indicated in FIG. 2, the well layers 111 and 113 near the n-type semiconductor layer 100 are formed by GaInN having higher content of indium and have a thickness H1. The well layers 115 and 117 near the p-type semiconductor layer 120 have a thickness H2. The thickness H1 is larger than the thickness H2. In addition, the barrier layers 112, 114, 116 and 118 of the active layer 110 are formed by GaInN having lower content of indium, so that the energy gap of the barrier layers 112, 114, 116 and 118 is larger than that of the well layers 111, 113, 115 and 117.

As indicated in FIGS. 1 and 2, the semiconductor light emitting structure 10 may include an electron blocking layer 130 disposed between the active layer 110 and the p-type semiconductor layer 120. The electron blocking layer 130 may be formed by gallium nitride (GaN), indium gallium nitride (InGaN), aluminum gallium nitride (AlGaN), aluminum indium gallium nitride (AlInGaN) or a combination thereof. The electron blocking layer 130 is preferably formed by an AlGaN semiconductor material whose energy gap is larger than that of the barrier layers 112, 114, 116 and 118 and that of the well layers 111, 113, 115 and 117. Besides, the electron blocking layer 130 can be further thinned. A thinner electron blocking layer is easier for the electron holes to pass through and be transmitted to the active layer 110. As a result, the conversion efficiency of the active layer 110 is relatively increased.

Second Embodiment

Figure 3:
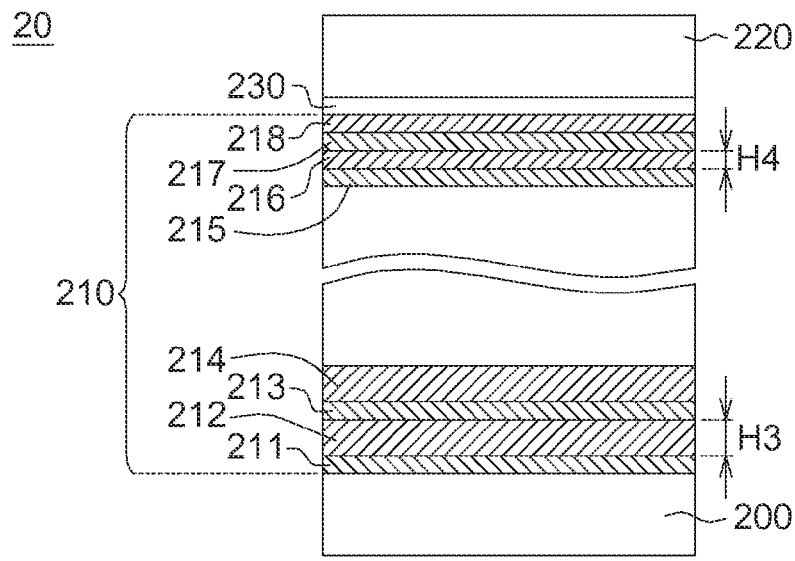
FIG. 3 shows a schematic diagram of a semiconductor light emitting structure according to another embodiment of the invention.

Referring to FIG. 3, a schematic diagram of a schematic diagram of a semiconductor light emitting structure according to another embodiment of the invention. The semiconductor light emitting structure 20 includes an n-type semiconductor layer 200, a p-type semiconductor layer 220 and an active layer 210 disposed between the n-type semiconductor layer 200 and the p-type semiconductor layer 220. The active layer 210 may be a multi-quantum well (MQW) structure having 1030 layers but the invention is not limited thereto. In the present embodiment, the barrier layers 212 and 214 near the n-type semiconductor layer 200 at least include a barrier layer having a first thickness H3, and the barrier layers 216 and 218 near the p-type semiconductor layer 220 at least include a barrier layer having a second thickness H4 smaller than the first thickness H3, and there is a differential Δd2 between the first thickness H3 and the second thickness H4. Preferably, 0 nm<Δd2≤100 nm. That is, in the present embodiment, the thickness of the well layer near the n-type semiconductor layer 200 is increased so that more electrons e⁻ are restricted to be within the area of the active layer 210 near the n-type semiconductor layer 200 when electrons flow to the active layer 210 form the n-type semiconductor layer 200, and the conversion efficiency of the active layer 210 is enhanced.

Figure 4:
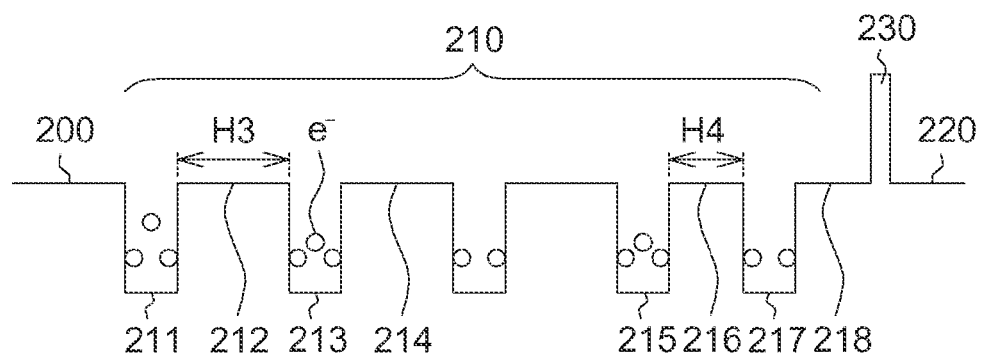
FIG. 4 shows a schematic diagram of an energy band of a semiconductor light emitting structure of FIG. 3.

FIG. 4 shows a schematic diagram of an energy band of a semiconductor light emitting structure 20 of FIG. 3. As indicated in FIG. 4, the barrier layers 212 and 214 near the n-type semiconductor layer 200 are formed by GaInN having lower content of indium and have a thickness H3. The barrier layers 216 and 218 near the p-type semiconductor layer 220 have a thickness H4. The thickness H3 is larger than the thickness H4. In addition, the indium content of GaInN can be adjusted, so that the energy gap of the barrier layers 212, 214, 216 and 218 of the active layer 210 is larger than that of the well layers 211, 213, 215 and 217.

As indicated in FIGS. 3 and 4, the electron blocking layer 230 is disposed between the active layer 210 and the p-type semiconductor layer 220. The electron blocking layer 230 is preferably formed by an AlGaN semiconductor material having a larger energy gap, so that the energy gap of the electron blocking layer 230 is larger than that of the barrier layers 212, 214, 216 and 218. Besides, the electron blocking layer 230 can be further thinned. A thinner electron blocking layer is easier for the electron holes to pass through and be transmitted to the active layer 210. As a result, the conversion efficiency of the active layer 210 is relatively increased.

Third Embodiment

Figure 5A:
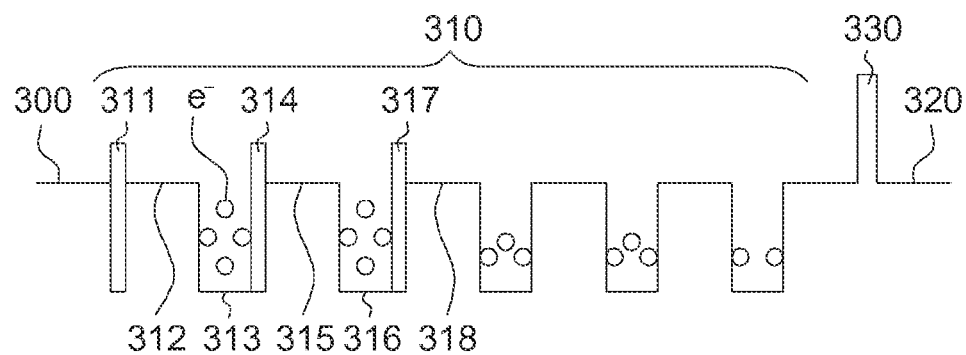
FIGS. 5A-5C respectively are schematic diagrams of an energy band of a semiconductor light emitting structure according to an alternate embodiment of the invention.
Figure 5B:
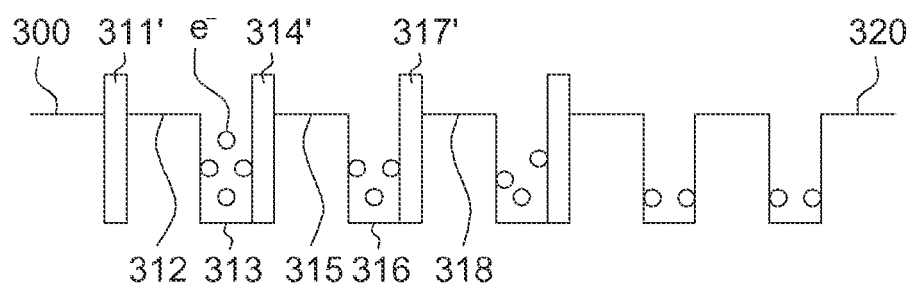
Figure 5C:
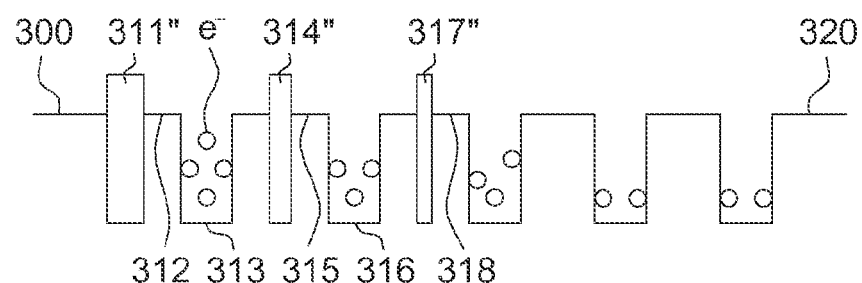

Referring to FIGS. 5A-5C, schematic diagrams of an energy band of a semiconductor light emitting structure according to an alternate embodiment of the invention are shown. The thicknesses of the well layer and the barrier layer of the semiconductor light emitting structure are changed in the above embodiments but remain unchanged in the present embodiment. In the present embodiment, several first electron blocking layers 311, 314 and 317 are distributed in the area of the active layer 310 near the n-type semiconductor layer 300. As indicated in FIG. 5A, the first electron blocking layers 311, 314 and 317 near the n-type semiconductor layer 300 are interlaced and stacked with the well layer 313 and 316 and the barrier layers 312, 315 and 318, so that the ability to restrict electrons e⁻ within the area of the active layer 310 near the n-type semiconductor layer 300 is increased. The first electron blocking layers 311, 314 and 317 are preferably formed by an AlGaN semiconductor material containing an n-type dopant. The n-type dopant, such as silicon, can provide additional free electrons. The energy gap of the first electron blocking layers 311, 314 and 317 is larger than that of the barrier layers 312, 315 and 318 and that of the well layers 313 and 316, so that more electrons e⁻ are restricted within the area of the active layer 310 near the n-type semiconductor layer 300, and the conversion efficiency of the active layer 310 is enhanced accordingly.

In addition, the semiconductor light emitting structure includes a second electron blocking layer 330 disposed between the active layer 310 and the p-type semiconductor layer 320. The second electron blocking layer 330 is preferably formed by an AlGaN semiconductor material whose energy gap is larger than that of the first electron blocking layers 311, 314 and 317.

Referring to FIG. 5B, several first electron blocking layers 311', 314' and 317' are respectively disposed between the well layers 313 and 316 and the barrier layers 312, 315 and 318 at an equal distance or thickness. In comparison to FIG. 5A, the first electron blocking layers 311', 314' and 317' of FIG. 5B are thicker than the first electron blocking layers 311, 314 and 317 of FIG. 5A, and the second electron blocking layer 330 of FIG. 5A is not disposed in FIG. 5B. Referring to FIG. 5C, several first electron blocking layers 311", 314" and 317" are respectively disposed between the well layers 313 and 316 and the barrier layers 312, 315 and 318. In comparison to FIG. 5B, the thickness of the first electron blocking layers 311", 314" and 317" are gradually reduced in a direction proceeding towards the p-type semiconductor layer 320 from the n-type semiconductor layer 300.

Since the first electron blocking layers are distributed separately and are doped with an n-type dopant, the series resistance of the active layer 310 will not be too high and the semiconductor light emitting structure can thus be driven by a lower bias voltage. Besides, the separate first electron blocking layers make the electrons e⁻ uniformly distributed to each area of the active layer 310, and the luminous uniformity of the light emitted by the active layer 310 is thus improved.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor light emitting structure, comprising:
an n-type semiconductor layer;
a p-type semiconductor layer; and
an active layer disposed between the n-type semiconductor layer and the p-type semiconductor layer, wherein the active layer is a multi-quantum structure consisting of a plurality of well layers and a plurality of barrier layers interlaced and stacked to each other; and
a plurality of first electron blocking layers, wherein the first electron blocking layers stacked with some of the well layers and the barrier layers near the n-type semiconductor layer are interlaced, and the first electron blocking layers are absent in the others of the well layers and the barrier layers near the p-type semiconductor layer, so that the ability to restrict electrons within an area of the active layer near the n-type semiconductor layer is increased, and a conversion efficiency of the active layer is enhanced.

2. The semiconductor light emitting structure according to claim 1, wherein the first electron blocking layers are disposed between the well layers and the barrier layers at an equal distance or thickness.

3. The semiconductor light emitting structure according to claim 1, wherein thicknesses of the first electron blocking layers are gradually reduced in a direction proceeding towards the p-type semiconductor layer from the n-type semiconductor layer.

4. The semiconductor light emitting structure according to claim 1, wherein an energy gap of the first electron blocking layers is larger than that of the barrier layers, and the energy gap of the barrier layers is larger than that of the well layers.

5. The semiconductor light emitting structure according to claim 1, wherein the n-type semiconductor layer, the p-type semiconductor layer, the well layers and the barrier layers are formed by a material selected from a group consisting of gallium nitride (GaN), indium gallium nitride (InGaN), aluminum gallium nitride (AlGaN) and aluminum indium gallium nitride (AlInGaN).

6. The semiconductor light emitting structure according to claim 1, wherein the first electron blocking layers contain an n-type dopant.

7. The semiconductor light emitting structure according to claim 1, wherein the first electron blocking layers are formed by AlGaN.

8. The semiconductor light emitting structure according to claim 6, wherein the n-type dopant is formed by silicon.

9. The semiconductor light emitting structure according to claim 1, wherein an energy gap of the first electron blocking layers is larger than that of the barrier layers, and the energy gap of the barrier layers is larger than that of the well layers.

10. The semiconductor light emitting structure according to claim 9, further comprising a second electron blocking layer disposed between the active layer and the p-type semiconductor layer, and an energy gap of the second electron blocking layer is larger than that of the first electron blocking layers.

11. The semiconductor light emitting structure according to claim 10, wherein the second electron blocking layer is formed by a material selected from a group consisting of gallium nitride (GaN), indium gallium nitride (InGaN), aluminum gallium nitride (AlGaN) and aluminum indium gallium nitride (AlInGaN).

12. The semiconductor light emitting structure according to claim 1, wherein the first electron blocking layers are absent in at least three well layers and at least three barrier layers which are alternately arranged and near the p-type semiconductor layer.

* * * * *